(12) United States Patent
Akarvardar et al.

(10) Patent No.: US 9,224,865 B2
(45) Date of Patent: Dec. 29, 2015

(54) FINFET WITH INSULATOR UNDER CHANNEL

(71) Applicant: GLOBALFOUNDRIES Inc., Grand Cayman (KY)

(72) Inventors: Murat Kerem Akarvardar, Saratoga Springs, NY (US); Jody A. Fronheiser, Delmar, NY (US); Ajey Poovannummoottil Jacob, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/945,627

(22) Filed: Jul. 18, 2013

(65) Prior Publication Data

US 2015/0021663 A1    Jan. 22, 2015

(51) Int. Cl.
*H01L 29/78* (2006.01)
*H01L 29/66* (2006.01)

(52) U.S. Cl.
CPC ........ *H01L 29/785* (2013.01); *H01L 29/66545* (2013.01); *H01L 29/66795* (2013.01)

(58) Field of Classification Search
USPC ....................................................... 438/268
See application file for complete search history.

(56) References Cited

U.S. PATENT DOCUMENTS

| | | | |
|---|---|---|---|
| 5,926,722 A | 7/1999 | Jang et al. | |
| 5,963,811 A | 10/1999 | Chern | |
| 6,635,543 B2 | 10/2003 | Furukawa et al. | |
| 7,871,873 B2 | 1/2011 | Maszara et al. | |
| 8,048,723 B2 | 11/2011 | Chang et al. | |
| 8,866,204 B2 | 10/2014 | Liu et al. | |
| 2004/0063286 A1* | 4/2004 | Kim et al. | 438/283 |
| 2006/0071213 A1 | 4/2006 | Ma et al. | |
| 2007/0000897 A1 | 1/2007 | Ingle et al. | |
| 2007/0090443 A1 | 4/2007 | Choi et al. | |
| 2007/0102834 A1 | 5/2007 | Enicks et al. | |
| 2007/0249174 A1 | 10/2007 | Yang | |
| 2007/0272954 A1* | 11/2007 | Chen et al. | 257/288 |
| 2010/0163971 A1 | 7/2010 | Hung et al. | |
| 2013/0026539 A1 | 1/2013 | Tang et al. | |
| 2013/0244387 A1 | 9/2013 | Cho | |
| 2013/0330889 A1 | 12/2013 | Yin et al. | |
| 2014/0061734 A1* | 3/2014 | Basker et al. | 257/288 |
| 2014/0103451 A1 | 4/2014 | Ouyang et al. | |

(Continued)

OTHER PUBLICATIONS

Akarvardar et al., "Bulk FINFET with Partial Dielectric Isolation Feature a Punch-Through Stopping Layer Under the Oxide," U.S. Appl. No. 13/927,698, filed Jun. 26, 2013.

(Continued)

*Primary Examiner* — Zandra Smith
*Assistant Examiner* — Lawrence Tynes, Jr.
(74) *Attorney, Agent, or Firm* — Wayne F. Reinke, Esq.; Heslin Rothenberg Farley & Mesiti P.C.

(57) ABSTRACT

A FinFET has a structure including a semiconductor substrate, semiconductor fins and a gate spanning the fins. The fins each have a bottom region coupled to the substrate and a top active region. Between the bottom and top fin regions is a middle stack situated between a vertically elongated source and a vertically elongated drain. The stack includes a top channel region and a dielectric region immediately below the channel region, providing electrical isolation of the channel. The partial isolation structure can be used with both gate first and gate last fabrication processes.

9 Claims, 7 Drawing Sheets

(56) References Cited

U.S. PATENT DOCUMENTS

| | | | |
|---|---|---|---|
| 2014/0124842 A1* | 5/2014 | Wang et al. | 257/288 |
| 2014/0124863 A1 | 5/2014 | Cheng et al. | |
| 2014/0159123 A1 | 6/2014 | Cheng et al. | |
| 2014/0191296 A1 | 7/2014 | Bergendahl et al. | |
| 2014/0252497 A1 | 9/2014 | Peng et al. | |
| 2015/0001591 A1 | 1/2015 | Akarvardar et al. | |
| 2015/0021663 A1 | 1/2015 | Akarvardar et al. | |
| 2015/0021690 A1 | 1/2015 | Jacob et al. | |
| 2015/0021691 A1 | 1/2015 | Alarvardar et al. | |
| 2015/0021709 A1 | 1/2015 | Jacob et al. | |
| 2015/0024572 A1 | 1/2015 | Jacob et al. | |

OTHER PUBLICATIONS

Akarvardar et al., Office Action for U.S. Appl. No. 13/945,455, filed Jul. 18, 2013 (U.S. Patent Application Publication No. 2015/0021691 A1), dated Nov. 14, 2014.

Akarvardar et al., Office Action for U.S. Appl. No. 13/945,455, filed Jul. 18, 2013 (U.S. Patent Application Publication No. 2015/0021691 A1), dated Jan. 21, 2015.

Jacob et al., Office Action for U.S. Appl. No. 13/945,379, filed Jul. 18, 2013 (U.S. Patent Application Publication No. 2015/0021709 A1), dated Sep. 8, 2014.

Jacob et al., Office Action for U.S. Appl. No. 13/945,415, filed Jul. 18, 2013 (U.S. Patent Application Publication No. 2015/0021690 A1), dated Jun. 12, 2014.

Akarvardar et al., Office Action for U.S. Appl. No. 13/927,698, filed Jun. 26, 2013 (U.S. Patent Application Publication No. 2015/0001591 A1), dated Sep. 2, 2014.

Akarvardar et al., Office Action for U.S. Appl. No. 13/927,698, filed Jun. 26, 2013 (U.S. Patent Application Publication No. 2015/0001591 A1), dated Oct. 20, 2014.

Akarvardar et al., Office Action for U.S. Appl. No. 13/927,698, filed Jun. 26, 2013 (U.S. Patent Application Publication No. 2015/0001591 A1), dated Feb. 24, 2015.

Akarvardar et al., Final Office Action for U.S. Appl. No. 13/927,698, filed Jun. 26, 2013 (U.S. Publication No. 2015/0001591 A1), dated Jul. 27, 2015.

Jacob et al., Office Action for U.S. Appl. No. 13/945,415 filed Jul. 18, 2013 (U.S. Publication No. 2015/0021690 A1), dated Mar. 31, 2015.

Jacob et al., Office Action for U.S. Appl. No. 13/945,379 filed Jul. 18, 2013 (U.S. Publication No. 2015/0021709 A1), dated May 6, 2015.

* cited by examiner

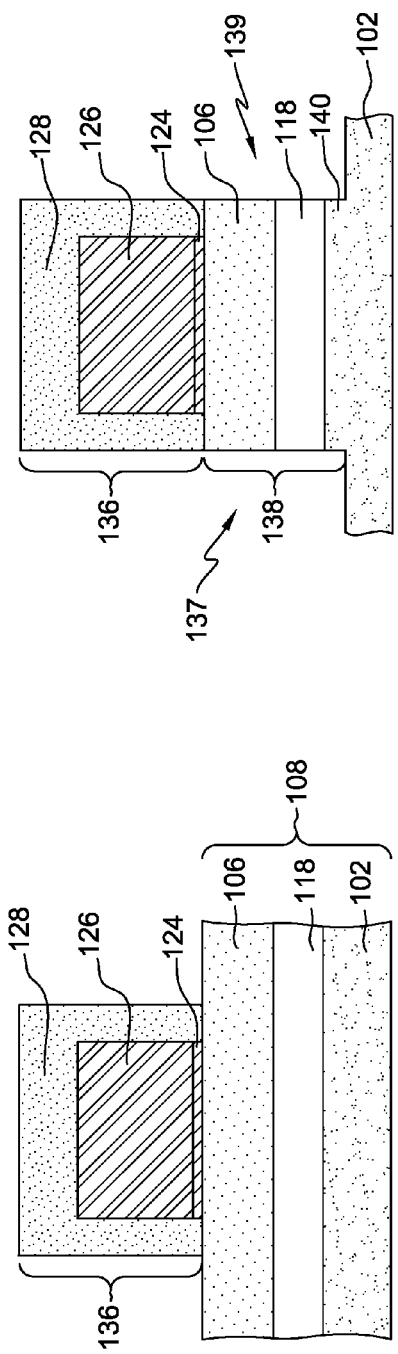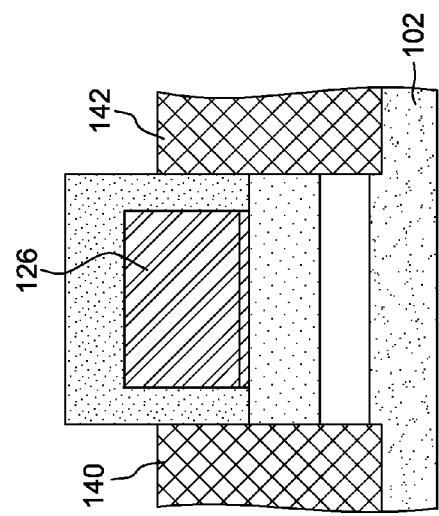

US 9,224,865 B2

FINFET WITH INSULATOR UNDER CHANNEL

BACKGROUND OF THE INVENTION

1. Technical Field

The present invention generally relates to semiconductor transistors. More particularly, the present invention relates to fabricating fins of a FinFET with a partial dielectric under only the channel region of the fins.

2. Background Information

Fin field-effect transistors (FinFET) devices have been developed to replace conventional planar bulk MOSFETs in advanced CMOS technology due to their improved short-channel effect immunity and $I_{on}/I_{off}$ ratio. However, a problem with bulk short channel FinFET devices, is that a leakage path from source to drain exists through a portion of the fin not covered by the gate, but lies below the channel. The leakage of current from source to drain through the lower (un-gated) part of the fin that is not covered by the gate, commonly known as punch-through leakage, causes an increase of static power consumption which is undesirable in modern submicron devices.

In one solution, punch-through leakage in submicron semiconductor devices is sought to be controlled by implanting a punch-through-stopper (PTS) dopant in a portion of the fin directly below the channel. However, the impurities doped by the punch-through-stopper (PTS) implantation may diffuse into the channel region, increasing the variability due to random dopant fluctuation (RDF) and lowering the carrier mobility of the channel region.

Thus there continues to be a need for a solution to the punch-through leakage problem.

SUMMARY OF THE INVENTION

The shortcomings of the prior art are overcome and additional advantages are provided through the provision, in one aspect, of a method of electrically isolating a channel region of a transistor. The method includes providing a semiconductor structure, the structure including a bulk semiconductor substrate, and at least one semiconductor fin, each fin including a top active region, a bottom region coupled to the substrate, and a dielectric region directly below the top region and above the bottom region, wherein a dielectric of the dielectric region encases the bottom region and the dielectric region. The method further includes building a gate spanning the at least one fin over a channel region thereof, recessing areas of the top active region and the dielectric region on either side of the channel region after building the gate, such that the dielectric region remains only under the channel region, and creating a source and a drain in the recessed areas.

In accordance with another aspect, a semiconductor structure is provided, the structure including a bulk semiconductor substrate, and at least one semiconductor fin. The at least one fin includes a bottom region coupled to the substrate, and an active region above the bottom region, the active region including a source, a drain, and a middle stack between the source and the drain. Further the middle stack is directly above the bottom region and includes a top channel region, and a dielectric region, wherein top and bottom surfaces of the dielectric region are in direct contact with the top channel region and the bottom region, respectively.

These, and other objects, features and advantages of this invention will become apparent from the following detailed description of the various aspects of the invention taken in conjunction with the accompanying drawings.

BRIEF DESCRIPTION OF THE DRAWINGS

FIG. 12 depicts the structure of FIG. 11 after anisotropic etching of the sidewall spacer material to encapsulate the gate structure, in accordance with one or more aspects of the present invention.

FIG. 13 depicts the structure of FIG. 12, after etching through portions of the multilayer structure (see FIG. 2) on either side of the encapsulated gate structure, in accordance with one or more aspects of the present invention.

FIG. 14 depicts the structure of FIG. 13, after epitaxially growing source and drain regions, in accordance with one or more aspects of the present invention.

DETAILED DESCRIPTION OF THE INVENTION

Figure 1:
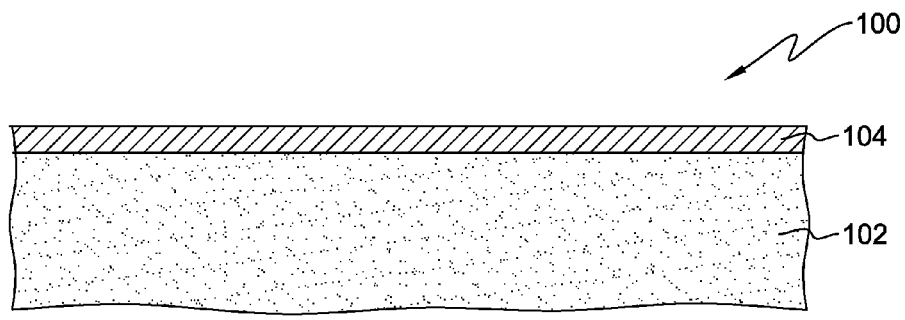
FIG. 1 is one example of a semiconductor structure including an epitaxial growth of silicon germanium over a bulk silicon substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures designate the same or similar components.

FIG. 1 illustrates a simplified view of a semiconductor structure, generally denoted by 100, obtained during an intermediate stage of semiconductor fabrication. At the stage of fabrication depicted in FIG. 1, the semiconductor structure 100, includes a substrate 102, such as a semiconductor material, for example, bulk silicon. A sacrificial layer 104, including an oxidizable material, may be formed over the substrate 102. In one example, the sacrificial layer 104 may include a layer of silicon germanium, which may be expressed as $Si_{1-x}Ge_x$ wherein x, the atomic percentage of germanium in silicon, may be less than or substantially equal to about 1, although the atomic percentage is preferred to be about 0.3 to about 0.7. In a specific example, the atomic percentage of germanium present in the layer of silicon germanium may be about 0.5. The silicon germanium sacrificial layer 104, may be formed, for example, by various epitaxial growth processes such as ultra-high vacuum chemical vapor deposition (UHV-CVD), low-pressure CVD (LPCVD), reduced-pressure CVD (RPCVD), rapid thermal CVD (RTCVD) and molecular beam epitaxy (MBE). In one example, the CVD-based epitaxial growth may take place at a temperature of between about 400° C. to about 1100° C., while the molecular beam epitaxy may typically utilize a lower temperature. In a specific example, the selective epitaxial growth of silicon germanium layer may be performed using halogermanes and silanes as the source gases at temperatures below 600° C. The silicon germanium sacrificial layer 104 may have a thickness preferably, of about 20 nanometers to about 100 nanometers, depending on the metastable thickness of $Si_{1-x}Ge_x$ layer.

Figure 2:
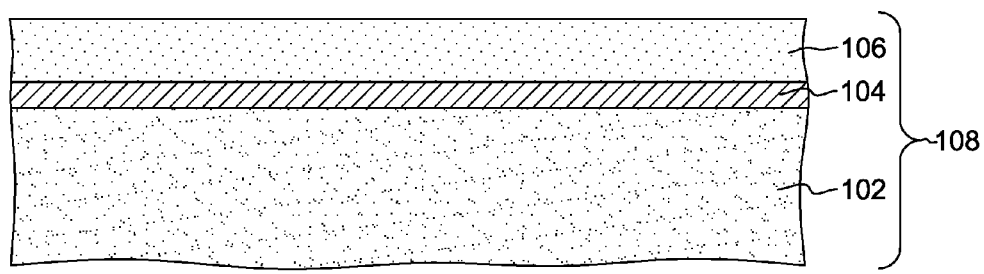
FIG. 2 depicts the structure of FIG. 1 after an epitaxial growth of single crystalline silicon over the layer of silicon germanium to form a multilayer structure, in accordance with one or more aspects of the present invention.

In one example, a selective epitaxial growth process may then be used to form a top active layer 106 over the sacrificial layer 104, as illustrated in FIG. 2, where the top active layer 106 would eventually become a channel area in subsequent processing steps. In a preferred example, the material of the top active layer 106 may be same as the material of the substrate 102. Further, it may be noted that the material of the sacrificial layer, such as, for example, silicon germanium, is substantially more susceptible to oxidation than the active layer or the substrate, due to the high oxidation rate of silicon germanium layer as compared to the oxidation rate of the silicon present in the active region and the bulk semiconductor substrate. This difference effectively allows selective oxidation of the sacrificial layer without damage to the active region or substrate. The epitaxial growth of the top active layer 106 over the sacrificial layer 104 results in a multilayer structure 108, which growth may stem from processes such as CVD or MBE to form the top active layer 106, the thickness of which may preferably be about 10 nanometers to about 50 nanometers. In one example, the thickness of the top active layer 106 may be about 30 nanometers. In one example, the top active layer 106, such as a layer of silicon, may be grown by flowing a reactant gas, such as dichlorosilane $SiH_2Cl_2$, trichlorosilane $SiHCl_3$, silicontetrachloride $SiCl_4$ or silane $SiH_4$ together with a carrier gas such as hydrogen gas to form a uniform silicon layer 106.

Figure 3:
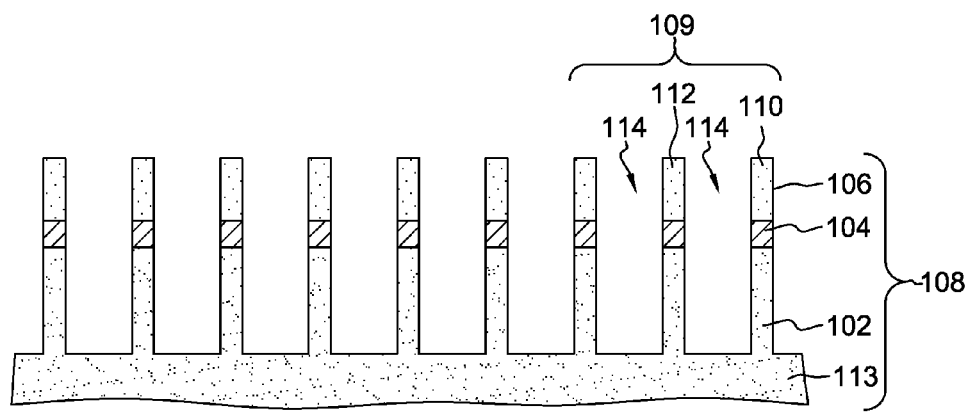
FIG. 3 depicts the structure of FIG. 2 after an anisotropic etching of the multilayer structure into a plurality of fins, in accordance with one or more aspects of the present invention.

The multilayer structure 108 may be etched through the top active layer 106 and through the sacrificial layer 104 and into a portion of the bulk silicon substrate 102 to create one or more fins 109, e.g., fins 110 and 112, above a bottom portion 113 of the bulk semiconductor material, as depicted in FIG. 3. The etching process may be performed by any suitable etching process, such as anisotropic dry etching process, for example, reactive-ion-etching (RIE) in sulfur hexafluoride ($SF_6$). In one example, the resulting fins each include a portion of the top active region 106, a portion of the sacrificial layer 104 and a bottom region of the substrate 102, separated by openings 114. In a specific example, the top silicon active layer 106 of a fin has a height of about 30 nanometers, the silicon germanium dielectric layer 104 has a height of about 20 nanometers, and the fin portion of the bulk silicon substrate 102 has a height of about 100 nanometers.

Figure 4:
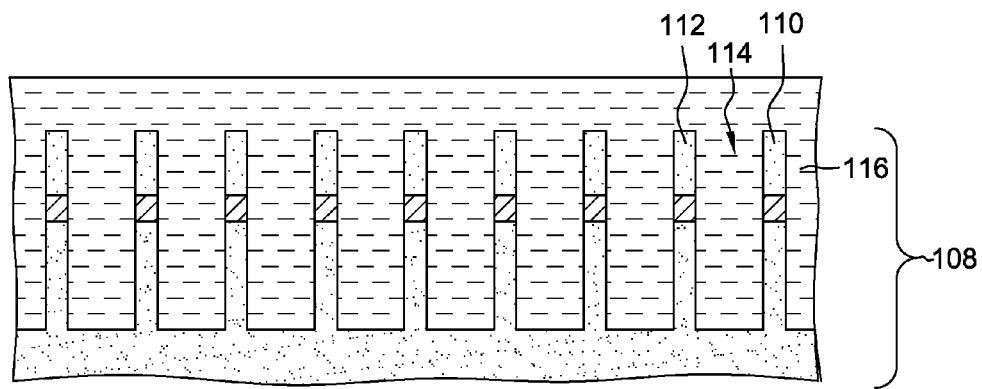
FIG. 4 depicts the structure of FIG. 3 after a conformal deposition of an oxide layer over the plurality of fins, in accordance with one or more aspects of the present invention.

Referring to FIG. 4, the fins, e.g., fins 110 and 112, are surrounded, including openings 114, with an oxide 116, for example, by a High Aspect Ratio Process (HARP). In one example, the HARP may include using an $O_3$/tetraethyl orthosilicate (TEOS) based sub-atmospheric chemical vapor deposition (SACVD) fill process to result in a conformal deposition of silicon oxide. HARP depositions may be advantageous for gapfill depositions of openings with high aspect ratios and may include both a slower deposition rate stage when the slower rate is advantageous for reducing defects, and a higher deposition rate stage when the high rate results in shorter deposition times.

Figure 5:
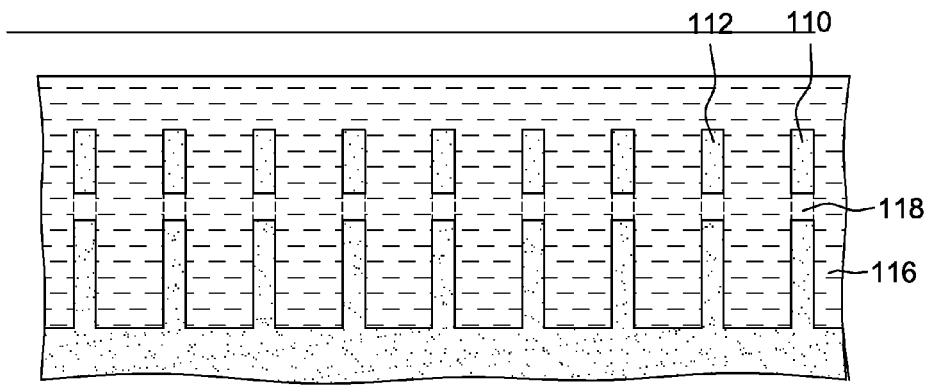
FIG. 5 depicts the structure of FIG. 4 after the oxidation or a high temperature anneal of the structure, resulting in the oxidation of the silicon germanium layer, in accordance with one or more aspects of the present invention.

As depicted in FIG. 5, after the HARP deposition, the fins in the present example are subjected to a selective oxidation process in the presence of the High Aspect Ratio Process (HARP) oxide layer 116 to form a layer of dielectric 118 by oxidizing the sacrificial layer 104. The selective oxidation process may be performed, for example, by subjecting the HARP oxide to a rapid thermal oxidation (RTO) procedure or by subjecting to an steam annealing procedure. It may be noted here, that performing the selective oxidation, by example, by annealing the sacrificial layer 104 in presence of the HARP oxide encapsulating the fins, electrically isolates the top active layer by converting the sacrificial layer to a dielectric layer, while also providing mechanical/physical stability to the fin structure and prevent the fin structure from tilting due to stress caused by the oxidation of the SiGe layer. There are many different scenarios and time/temperature combinations that would achieve the oxidation. In one example, the rapid thermal oxidation may be performed at about 900° C. for about 15 seconds. In another example, steam annealing may be performed in the presence of water vapor at about 500° C. for about 6 hours.

Figure 6:
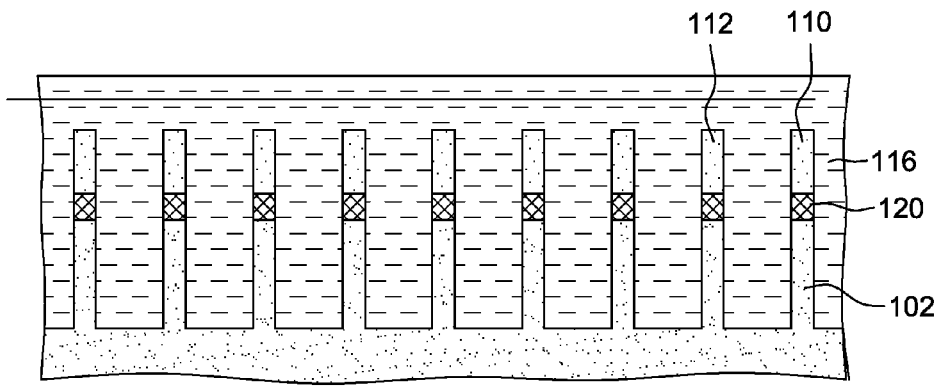
FIG. 6 depicts the structure of FIG. 5 after the partial oxidation of the silicon germanium layer, in accordance with one or more aspects of the present invention.

Alternately, it may be the case that annealing the oxidizable material of the sacrificial layer fails to completely oxidize the material, in this example, silicon germanium. In that case, as shown in FIG. 6, germanium oxide 120 or germanium crystals may be dispersed in that region of the fin, now an oxide (e.g., silicon dioxide), to create a dielectric matrix. Note that the dielectric material may include one material, a material with one or more impurities, an alloy or an alloy with one or more impurities. Note also that the dielectric matrix includes a dielectric material having one or more impurities as well as alloys along with the existing doping material. In a specific example, the sacrificial layer includes at least one dielectric material such as, for example, silicon dioxide, germanium, germanium oxide, germanium crystals, germanium crystals embedded in silicon dioxide and germanium crystals uniformly dispersed within silicon dioxide. The dispersed germanium may take the form of, for example, germanium nanocrystals. As one would expect, the more germanium that remains in the fin, the higher the likelihood of reducing the level of electrical isolation. Hence, coming as close as possible to full oxidation is preferred.

As will subsequently be explained in greater detail, the invention seeks to recess the HARP oxide by etching to expose a portion of the dielectric 118 and to create a channel region by electrically isolating the top active layer 106 from the rest of the fin below. The invention so far describes the realization of SOI-like FinFETs on a bulk substrate in the sense that the top active semiconductor is entirely isolated from the bottom substrate with a continuous dielectric material. However, there are instances where it may be more beneficial to keep the insulator only under the channel rather than having it continuous across the entire wafer. The sequence described onwards is related to this "partial dielectric isolation" scheme. In that scheme, the fabrication process continues with gate formation. This can be either the "real gate" or the "dummy gate" depending on whether a gate-first or a gate-last scheme is pursued, respectively. In the gate-last process, a gate dielectric layer may be wrapped around and across a portion of the electrically isolated active layer. A sacrificial gate material may be provided over the gate dielectric layer and patterned to define a sacrificial gate structure. Subsequently, a silicon nitride spacer is deposited and anisotropically etched such that the sacrificial gate is encapsulated with silicon nitride from the sides as well as from the top. The fabrication process further proceeds by recessing the top active region 106 to create source and drain regions, as well as recessing the dielectric 118 under them in such a way as to expose the bottom semiconductor substrate 102. See FIG. 10 and the description thereof. The etching creates a middle stack under the gate and spacers having a top channel region, a bottom region below the top channel region, and a dielectric material directly below the channel region and above the bottom region. Further, the source and the drain extend vertically along either side and higher than an top surface of the middle stack.

Figure 7:
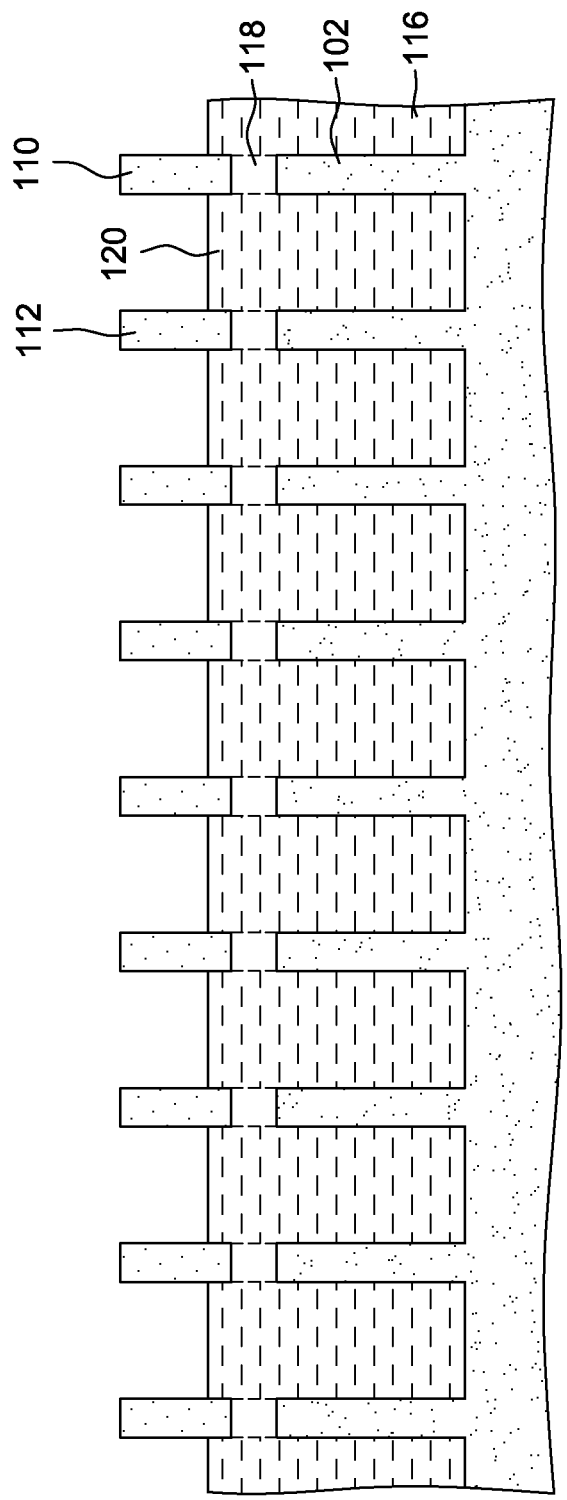
FIG. 7 depicts the structure of FIG. 5, after an isotropic etch of the oxide layer surrounding the plurality of fins, in accordance with one or more aspects of the present invention.

Accordingly, referring to FIG. 7, the oxide 116 surrounding the fins, e.g., fins 110 and 112, may be recessed through the top active region 106 to above the upper surface 120 of the dielectric layer 118 of the fins, e.g., fins 110 and 112. Any suitable etching process, such as isotropic dry etching process, for example, SiCoNi etch process, may be employed to recess the HARP oxide 116. In one specific example, a dry etching process, such as SiCoNi etching may be employed to remove silicon oxides by using gas mixtures such as, for example, ammonia ($NH_3$) and nitrogen trifluoride ($NF_3$) in a plasma processing chamber. As discussed above, the dielectric layer 118 may include impurities such as, for example, silicon dioxide, germanium oxide and germanium crystals embedded in silicon dioxide.

Figure 8:
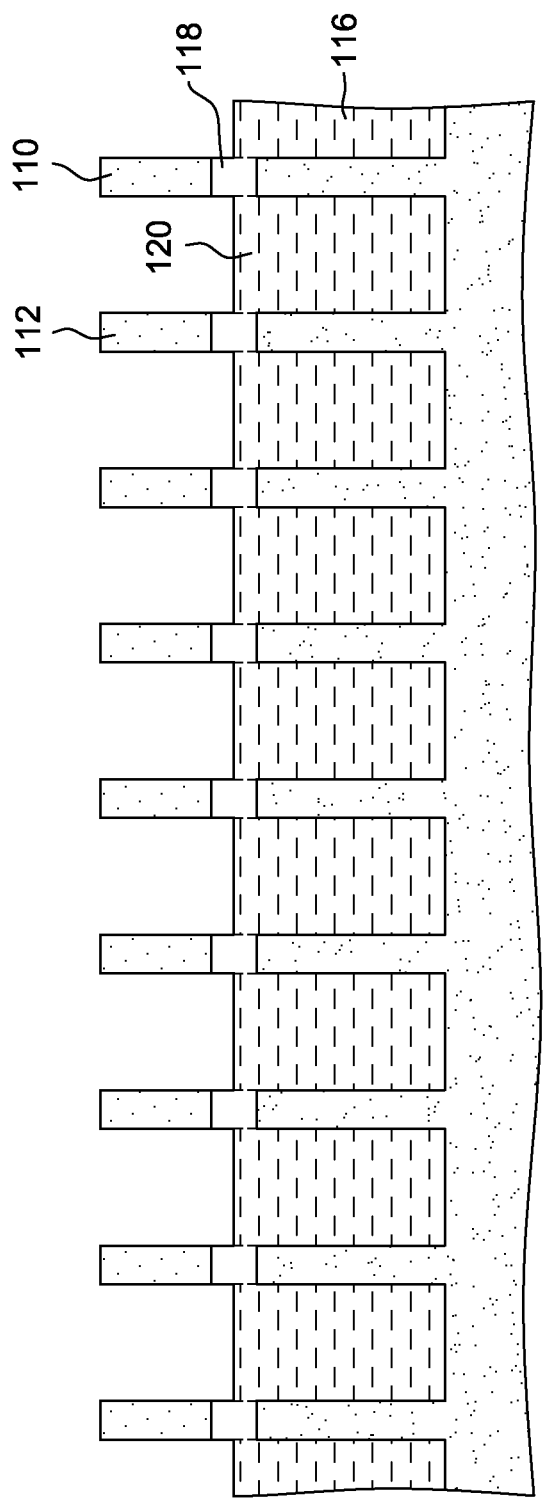
FIG. 8 depicts the structure of FIG. 7, after an anisotropic etch of the oxide layer surrounding the plurality of fins, in accordance with one or more aspects of the present invention.

Alternatively, the oxide 116 surrounding the fins, e.g., fins 110 and 112, may also be recessed by employing a directional anisotropic etching step to etch the HARP oxide 116 through the top active region 106 such as to expose a portion of the dielectric 118 of the fins, e.g., fins 110 and 112, as depicted in FIG. 8. In one specific example, the directional anisotropic etching step may be performed using reactive ion etching (RIE) using fluorine based chemistry and involving process gases such as tetrafluoromethane ($CF_4$), trifluoromethane ($CHF_3$), difluoromethane ($CH_2F_2$), fluoromethane ($CH_3F$), octafluorocyclobutane ($C_4F_8$), hexafluoro-1,3-butadiene ($C_4F_6$), sulfur hexafluoride ($SF_6$) and oxygen ($O_2$).

Figure 9:
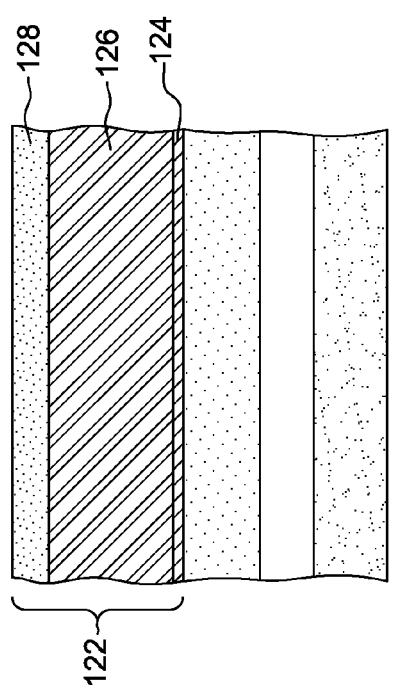
FIG. 9 is a cross-sectional view of one example of one of the fins of FIG. 8 after the provision of a dummy gate stack structure over the plurality of fins, in accordance with one or more aspects of the present invention.

The fabrication process may be continued further, for example, with a conventional "gate-last" process. As shown in FIG. 9, a dummy gate stack 122 may be disposed across a portion of the electrically isolated top active region 106 of the fins, e.g., fins 110 and 112 situated in the multilayer structure 108 (see FIG. 8). Each of the gate stacks 122 include one or more conformally deposited layers, such as a thin oxide 124 (also referred to as dummy or sacrificial oxide layer), and a dummy gate material 126, such as, for example, amorphous silicon, disposed over thin oxide layer 124 to hold the gate position for subsequent metal gate material. The various layers of the dummy gate stack may be formed from a variety of different materials using a variety of techniques, such as, for example, atomic layer deposition (ALD) and chemical vapor deposition (CVD). The thickness of the layers may also vary, depending upon the particular application.

Continuing further with FIG. 9, a hard mask layer 128 may be formed over the dummy gate material 126. In one example, hard mask layer 128 may include a material such as, for example, silicon nitride and may be deposited using conventional deposition processes, such as, for example, chemical vapor deposition (CVD), low pressure CVD, or plasma-enhanced CVD (PECVD). In a specific example, silicon nitride may be deposited using process gases, such as, for example, dichlorosilane ($SiH_2Cl_2$) and ammonia ($NH_3$) under known process conditions. In another example, silicon nitride may also or alternatively be deposited using a halogen-free precursor such as, for example, bis(t-butylamino)silane (BT-BAS) ($SiC_8N_2H_{22}$) and ammonia ($NH_3$) at about 550° C.

Figure 10:
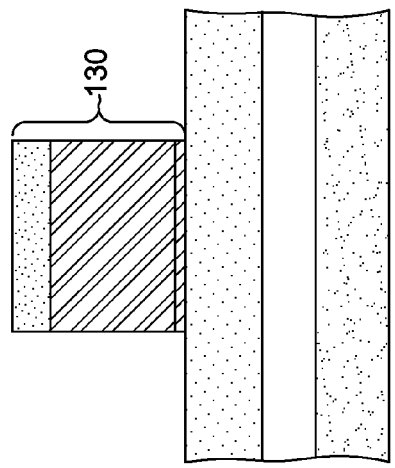
FIG. 10 depicts the structure of FIG. 9 after patterning and etching of the dummy gate stack to define a gate structure, in accordance with one or more aspects of the present invention.

A portion of dummy gate stack 122 may be etched through a portion of hard mask layer 128 and extending through a portion of dummy gate material 126 and thin oxide 124, to define a gate structure 130, as depicted in FIG. 10. The etching process may be any suitable etching process, such as anisotropic dry etching process, for example, reactive ion etching (RIE) or isotropic wet etching processes. In one example, the gate structure 130 includes a portion of hard mask layer 128, a portion of the dummy gate material 126 and a bottom portion of thin oxide 124, with the thin oxide 124 residing over a portion of electrically isolated top active region 106 of the fins.

Figure 11:
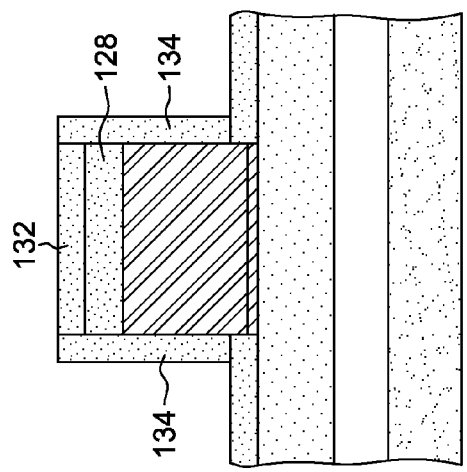
FIG. 11 depicts the structure of FIG. 10 after providing a sidewall spacer material over the gate structure, in accordance with one or more aspects of the present invention.

Referring to FIG. 11, a sidewall spacer material 132 is conformally deposited over the gate structure 130, and etched using an anisotropic etching process, such that the sidewalls of the gate structure 130 are encapsulated with the sidewall spacer material. Sidewall spacers 134 are formed from the sidewall spacer material on either side of the gate structure 130 during the etching process. In a preferred example, the material of the sidewall spacer material 132 may be the same as the material of the hard mask layer 128. In a specific example, the sidewall spacer material 132 may include a material such as, for example, silicon nitride and may be deposited using conventional deposition processes, such as, for example, chemical vapor deposition (CVD), low pressure CVD, or plasma-enhanced CVD (PECVD). In a specific example, silicon nitride may be deposited using process gases, such as, for example, dichlorosilane ($SiH_2Cl_2$) and ammonia ($NH_3$) and using known process conditions. In another example, the sidewall spacer material 132 may include a material such as, for example, silicon oxide, an oxynitride or a combination thereof.

As depicted in FIG. 12, dummy gate and spacer structure 136 remains after a portion of the sidewall spacer material 132 is selectively removed on either side of the dummy gate by one or more etching processes, without affecting the sidewall spacer material 132 encapsulating the sides and top of gate structure 130 from the top and the sides. The sidewall spacer material 132 may be selectively etched using conventional anisotropic dry-etching processes such as, reactive ion etching or plasma etching. In one specific example, reactive ion etching may be performed using remote plasma involving process gases such as nitrogen trifluoride ($NF_3$) and hydrogen ($H_2$).

As shown in FIG. 13, removal of portions of the multilayer structure 108 (see e.g., FIG. 12) of a fin on either side of the dummy gate creates openings 137 and 139 for subsequent source and drain regions, respectively. More specifically, the multilayer structure 108 may be etched through a portion of the top active region 106, through a portion of the dielectric layer 118 and into a portion of the bulk silicon substrate 102 to form the source and drain regions. The result of the source and drain region etch is middle stack 138 under dummy gate and spacer structure 136. The etching process may be performed by any suitable etching process, such as anisotropic dry etching process, for example, reactive ion etching (RIE) using fluorine based chemistry and involving process gases such as tetrafluoromethane ($CF_4$), trifluoromethane ($CHF_3$), difluoromethane ($CH_2F_2$), fluoromethane ($CH_3F$), octafluorocyclobutane ($C_4F_8$), hexafluoro-1,3-butadiene($C_4F_6$), sulfur hexafluoride ($SF_6$) and oxygen ($O_2$). It may be noted that, in another example, the source and the drain region may extend vertically along either side and higher than a top surface of the middle stack. Thus, the volume of the source region and the drain region re-grown epitaxially in the subsequent fabrication processing increases the volume of those areas of the structure. This increase in the volume of the source region and the drain region in the subsequent fabrication processing, advantageously facilitates in inducing more stress into the channel region from the source region and the drain region as compared to a conventional silicon-on-isolation (SOI) structure. A properly stressed channel is desirable so as to allow the carrier mobility to improve and enhance the performance of the semiconductor device, and the effectiveness of the induced stress is proportional to the volume of the re-grown epitaxy.

Referring to FIG. 14, the source region 140 and drain region 142 may now be created in openings 137 and 139, using suitable techniques, such as, for example, in-situ-doped selective epitaxial growth. The source region 140 and drain region 142 may be epitaxially grown to create a lattice mismatch with the channel region, inducing stress into the channel region, which in turn, may improve the overall performance of the resultant semiconductor device. It will be understood that the positioning of the source and drain regions could be switched. As the conventional "gate-last" fabrication processing proceeds, the dummy gate and spacer structure 136 remains in place during initial processing until a high-temperature anneal is completed, that is, until the activation of the source region 140 and the drain regions 142 has been completed. Subsequently, the dummy gate structure 136 is removed and replaced with a metal gate stack, including one or more conformally deposited layers below the metal, for example, a high-K gate dielectric layer with a dielectric constant K greater than about, for instance, 3.9 (note that k=3.9 for $SiO_2$) over the active channel, and one or more work function layers disposed over the high-K gate dielectric layer.

Figure 15:
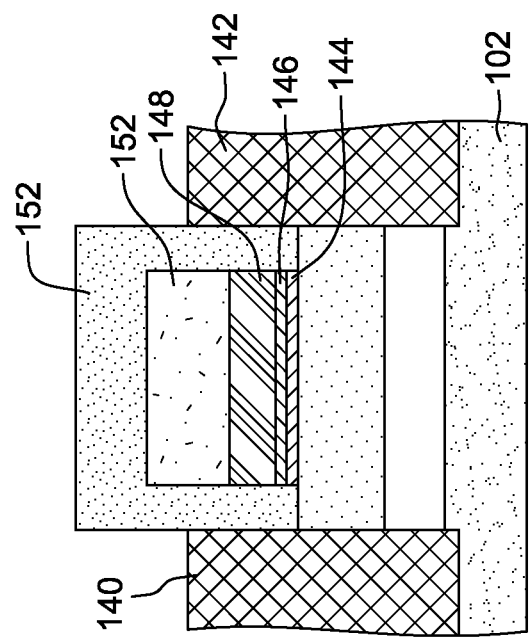
FIG. 15 depicts the resultant structure of FIG. 14, after providing a metal gate, in accordance with one or more aspects of the present invention.

Described above is the creation of a FinFET with isolated channel and vertically elongated source and drain, using a gate-last process. The present invention also works with a conventional "gate first" process, in which a metal gate is created instead of a dummy gate. In such a process, the dummy gate stack of FIG. 9 is not used, and instead a metal gate stack is created. The end result of processing is shown in FIG. 15. The metal gate stack includes, for example, one or more conformally deposited layers such as a high-K gate dielectric layer 144, and one or more work function layers 146 deposited over the high-K gate dielectric layers 144.

In one example for the gate-first process, the gate dielectric layer 144 may be formed of a material such as silicon dioxide or a high-k dielectric material with a dielectric constant k greater than about 3.9 (e.g., k=3.9 for $SiO_2$) and may be deposited by performing a suitable deposition process, such as atomic layer deposition (ALD), chemical vapor deposition (CVD), physical vapor deposition (PVD), or the like. Examples of high-k dielectric materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. One or more work-function layers 146 may be conformally deposited over the gate dielectric layer, for example, via a deposition process such as ALD, CVD or PVD. The work-function layer(s) may include, for instance, one or more P-type metals or one or more N-type metals, depending on whether the gate structure is to include, for instance, a PFET or an NFET. The work-function layer(s) may include an appropriate refractory metal nitride, for example, those from Groups IVa-VIa in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like. Metal gate 148 (also referred to as metal gate electrode) may be conformally deposited over one or more work-function layers 146 so as to tune the overall threshold voltage of the resultant semiconductor device. In one example, the metal gate may include a metal, such as, for example, tungsten (W), aluminum (Al), nickel (Ni), cobalt (Co), and titanium (Ti) and may be conformally deposited over the one or more work function layer(s) using processes, such as for instance, atomic layer deposition (ALD) or chemical vapor deposition (CVD). In one example, the thickness of the metal gate may be less than about 10 nanometers. A conventional amorphous silicon electrode 150, for instance, may be deposited over metal gate 148, using a variety of deposition techniques such as, for example, CVD or ALD processes. In one example, the amorphous silicon electrode may have a thickness of about 100 nanometers. A hard mask layer 152 may conformally be deposited over the amorphous silicon electrode 150 and may include a nitride or an oxide, such as, for example, silicon nitride or silicon oxide, or an oxynitride or a combination thereof. The deposition processes may include any conventional processes such as, for example, low temperature chemical vapor deposition(CVD), plasma-enhanced chemical vapor deposition (PECVD) or atomic layer deposition (ALD).

Although not shown in the figures for clarity of the invention, the gate fabrication process continues with the "gate-first process" employing corresponding steps employed in the "gate-last process," as described in above. The corresponding steps involved include, for example, etching to form a metal gate stack, conformally depositing a protective layer to encapsulate the metal gate stack, etching a portion of the multilayer structure 108 of a fin on either side of metal gate stack to create openings, creating source region and drain region in the openings.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a semiconductor structure, the structure comprising:
      a bulk semiconductor substrate; and
      at least one semiconductor fin, each fin comprising a top active region, a bottom region coupled to the substrate, and a dielectric region directly below the top region and above the bottom region, wherein a dielectric of the dielectric region encases the bottom region and the dielectric region;
   building a gate spanning the at least one fin over a channel region thereof;
   recessing areas of the top active region and the dielectric region on either side of the channel region after building the gate, such that the dielectric region remains only under the channel region; and
   creating a source and a drain in the recessed areas.

2. The method of claim 1, further comprising, prior to the recessing:
   conformally depositing a layer of a sidewall spacer material over the gate; and
   etching spacers on either side of the gate from the sidewall spacer layer.

3. The method of claim 1, wherein building the gate comprises:
   depositing a gate dielectric layer over the top active region of the at least one fin;
   depositing a gate metal layer over the gate dielectric layer; and depositing a gate electrode material over the gate metal layer.

4. The method of claim 1, wherein building the gate comprises building a dummy gate, the method further comprising replacing the dummy gate with a metal gate after creating the source and drain.

5. The method of claim 1, wherein creating the source and the drain comprises vertically extending the source and the drain higher than a top surface of the top active region of the at least one fin.

6. The method of claim 1, wherein the recessing further comprises recessing through a portion of the bottom region of the at least one fin, and wherein creating the source and the drain comprises epitaxially growing the source and the drain on a remaining portion of the bottom region.

7. The method of claim 6, wherein the epitaxially growing comprises creating a lattice mismatch with the channel region to induce stress into the channel region.

8. The method of claim 7, wherein creating the lattice mismatch comprises:
   removing the epitaxy of the source and drain; and
   regrowing the source and drain epitaxy.

9. The method of claim 1, wherein the semiconductor substrate, the top active region and the bottom region comprise silicon, and wherein the dielectric comprises one of silicon dioxide, germanium oxide and germanium crystals embedded in silicon dioxide.

* * * * *